United States Patent
Hirata et al.

(10) Patent No.: US 8,216,654 B2
(45) Date of Patent: Jul. 10, 2012

(54) COMPONENTS FOR A FILM-FORMING DEVICE AND METHOD FOR CLEANING THE SAME

(75) Inventors: Akisuke Hirata, Chiba-ken (JP); Shinji Isoda, Chiba-ken (JP); Yutaka Kadowaki, Chiba-ken (JP); Katsuhiko Mushiake, Tokyo (JP)

(73) Assignee: Ulvac, Inc., Kanagawa (JP)

( * ) Notice: Subject to any disclaimer, the term of this patent is extended or adjusted under 35 U.S.C. 154(b) by 880 days.

(21) Appl. No.: 10/538,856

(22) PCT Filed: Feb. 18, 2004

(86) PCT No.: PCT/JP2004/001799
§ 371 (c)(1),
(2), (4) Date: Nov. 8, 2005

(87) PCT Pub. No.: WO2004/074545
PCT Pub. Date: Sep. 2, 2004

(65) Prior Publication Data
US 2006/0246735 A1 Nov. 2, 2006

(30) Foreign Application Priority Data

Feb. 19, 2003 (JP) .................... 2003-040837

(51) Int. Cl.
*B23B 3/02* (2006.01)
(52) U.S. Cl. ....... 428/64.1; 428/325; 428/328; 428/564; 428/626
(58) Field of Classification Search .......... None
See application file for complete search history.

(56) References Cited

U.S. PATENT DOCUMENTS

| | | | | |
|---|---|---|---|---|
| 4,189,525 A | * | 2/1980 | Mori | 428/643 |
| 4,404,263 A | * | 9/1983 | Hodes et al. | 428/564 |
| 5,626,943 A | * | 5/1997 | Tenhover | 428/141 |
| 5,895,696 A | * | 4/1999 | Stanish et al. | 428/64.1 |
| 6,899,798 B2 | | 5/2005 | Weldon et al. | |
| 2003/0116276 A1 | | 6/2003 | Weldon et al. | |

FOREIGN PATENT DOCUMENTS

| | | |
|---|---|---|
| JP | 55-130817 A | 10/1980 |
| JP | 62-109971 A | 5/1987 |
| JP | 62-287063 A | 12/1987 |
| JP | 02-259064 A | 10/1990 |

(Continued)

*Primary Examiner* — Duy Deo
(74) *Attorney, Agent, or Firm* — Arent Fox LLP

(57) ABSTRACT

There are provided a film forming equipment component having a structure in which an deposited film d formed on the component can be separated from the component for a time period shorter than the prior art to reduce damage due to a cleaning fluid S, and a method of cleaning such a component. A metal film layer 2 electrochemically less noble than the matrix metal material 1 of the aforementioned component is formed on the surface of the matrix metal material 1 through thermal spraying, vapor depositing, sputtering, laminating or other process. Alternatively, a second metal film layer 3 electrochemically more noble than the aforementioned matrix metal material 1 is formed on the surface of the metal film layer 2 through said thermal spraying or other process. Thus, a local cell is formed between the metal film layer 2 and the matrix metal material 1 or the second metal film layer 3. Therefore, the deposited film d can be separated from the matrix metal material 1 for an extremely shortened time period, without damaging the matrix metal material 1 itself from the cleaning fluid S.

2 Claims, 1 Drawing Sheet

FOREIGN PATENT DOCUMENTS

| | | |
|---|---|---|
| JP | 3-87357 | 4/1991 |
| JP | 04-198500 A | 7/1992 |
| JP | 5-179424 | 7/1993 |
| JP | 5-206098 | 8/1993 |
| JP | 5-230624 A | 9/1993 |
| JP | 06-049626 A | 2/1994 |
| JP | 06-220600 A | 8/1994 |
| JP | 6-346254 | 12/1994 |
| JP | 7083133 A | 3/1995 |
| JP | 8-165582 | 6/1996 |
| JP | 11-124661 | 5/1999 |
| JP | 2002030494 A | 1/2002 |
| WO | WO 03/057647 A1 | 7/2003 |

* cited by examiner

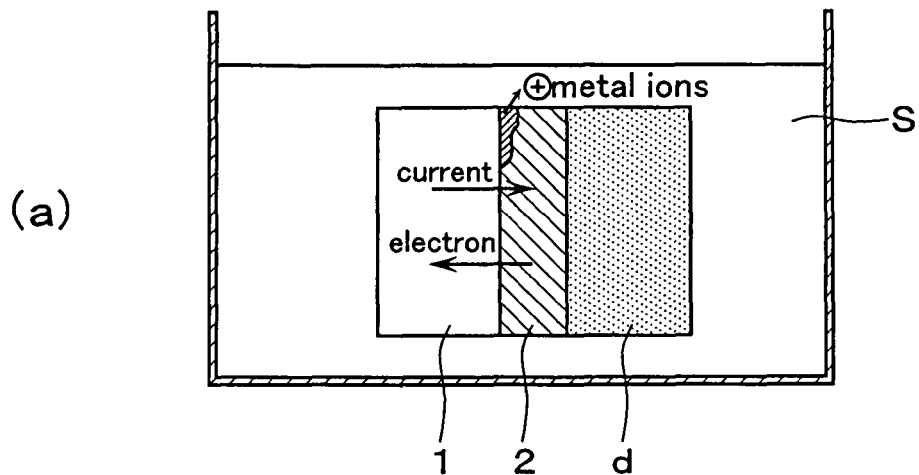
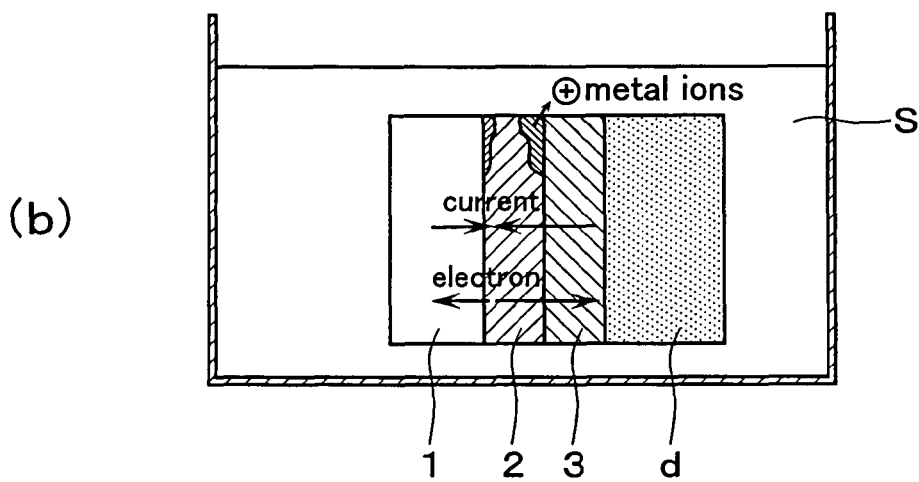
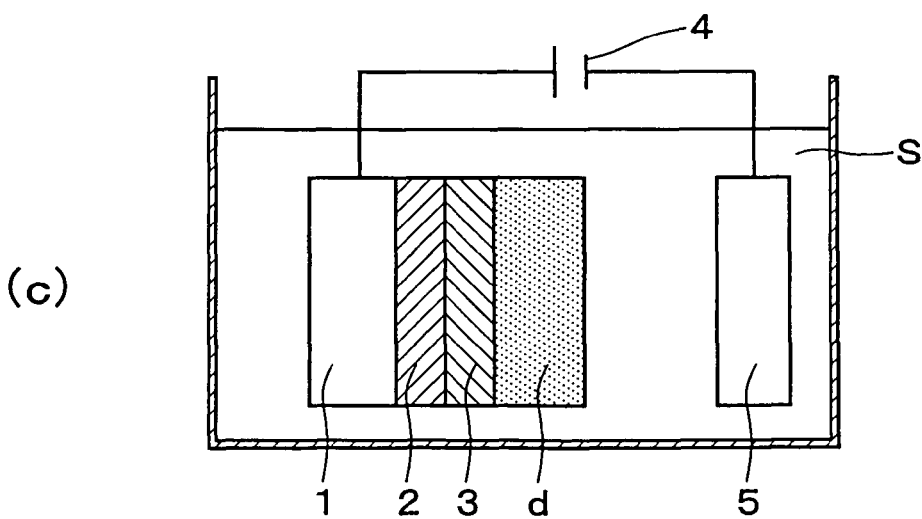

COMPONENTS FOR A FILM-FORMING DEVICE AND METHOD FOR CLEANING THE SAME

CROSS-REFERENCE TO RELATED APPLICATION

This application is a National Stage entry of International Application No. PCT/JP2004/001799, filed Feb. 18, 2004, the entire specification claims and drawings of which are incorporated herewith by reference.

TECHNICAL FIELD OF THE INVENTION

The present invention relates to a component for a film forming equipment which uses a film forming material to form various thin-films, and a method of cleaning such a component.

BACKGROUND ART

In a manufacturing process of semiconductor components used in large scale integrated circuits (LSI), solar batteries, liquid crystal displays, plasma displays and the like, the film-forming equipments for forming thin films on substrates through vapor depositing, sputtering, CVD or other process with a film-forming materials has been used.

The aforementioned film-forming material has also formed a deposited film over the surfaces of the components such as a buffer plates represented by a substrate mask and a wafer support frame in the film forming equipments when a thin film has been formed therein.

The aforementioned deposited film thickly accumulates on the components as a number of substrates are successively processed to form films thereon in the film forming equipments. If the accumulated deposited film is broken at a certain time point, dust occurs. The dust may fall on a substrate on which a film is being formed, resulting in damage of the intended properties in the formed film. This reduces the yield in the manufacturing products.

To overcome such a problem, Japanese Laid-Open Patent Application No. 1991-87357 has proposed a structure in which a deposited film thickly accumulated on a component cannot easily be broken/separated from the surface of the component as a result of a mechanical process such as cutting or peeling or a blasting process to the surface of the component.

If the aforementioned processed component is used in the film forming equipments, it is preferable in that the deposited film cannot easily be broken/separated from the surface of the component when a thin film is being formed.

Where the component from which the deposited film has been removed is to be re-used, however, it is difficult to remove the deposited film through the mechanical removing process because the above structure is configured to prevent the deposited film being easily broken/separated in the first place.

A chemical removal process for dissolving an deposited film by use of a cleaning fluid has also been proposed. Such a chemical process requires that a component with a deposited film is dipped in the cleaning fluid for about two days. This is disadvantageous in that the component may be more dissolved than the deposited film depending on the types of the cleaning fluid and deposited film.

To overcome such a problem, Japanese Laid-Open Patent Application No. 1999-124661 has proposed a component in which, to remove the deposited film while suppressing the dissolution of the component itself, the surface of a matrix metal material (e.g., aluminum or its alloy) in the aforementioned component is covered with a lower readily-soluble metal layer consisted of a metal more easily soluble in acid cleaning fluid than the matrix metal material (e.g., copper or its alloy), a porous metal film being then formed over the lower readily-soluble metal layer (e.g., see Patent document 2).

When the cleaning fluid reaches the lower readily-soluble metal film layer from the edges of the component and surface defects of a deposited film, it dissolves this lower readily-soluble metal film layer at the first time.

Therefore, the deposited film can be separated from the component for a shorter time period. In the aforementioned component according to the prior art, however, time period required to separate the deposited film from the component after the cleaning fluid has reached the lower readily-soluble metal film layer via the aforementioned porous metal film to dissolve the lower readily-soluble metal film layer is between 5 and 15 hours. Thus, time period for which the component is dipped in the cleaning fluid can certainly be shortened. However, the component must yet be dipped in the cleaning fluid for a long time, resulting in not a little damage to the matrix metal material.

Furthermore, the damage to the matrix metal material also results from the selection of material for the aforementioned lower readily-soluble metal film layer.

In other words, the prior art selected a metal more easily soluble into the acid cleaning fluid than the matrix metal material as the material for the aforementioned lower readily-soluble metal film layer. If the matrix metal material is aluminum or its alloy and when the component is dipped in the cleaning fluid for a long time, however, a local cell will be formed between the matrix metal material of aluminum or its alloy and the lower readily-soluble metal film layer of copper or its alloy by the potential difference since the aluminum is less noble than the copper or its alloy as can be seen from the natural electrode potential. This may more dissolve the matrix metal material.

An object of the present invention is thus to provide a component for a film forming equipment having a structure which can separate a deposited film from the component for a time period shorter than that of the prior art and reduce the damage to the matrix metal material from the cleaning fluid, and a method of cleaning such a component.

DISCLOSURE OF THE INVENTION

To overcome the aforementioned problems of the prior art, the component according to the present invention which is to be used in a film forming equipment for forming a thin film is characterized by that it comprises the surface of a matrix metal material formed with a metal film layer electrochemically less noble than the matrix metal material through a spraying, vapor depositing, sputtering, laminating or other process.

In such an arrangement, if the processed component is dipped in a cleaning fluid, a local cell is formed between the matrix metal material and the aforementioned metal film layer by a natural electrode potential difference therebetween, with the local current then flowing from the matrix metal material to the metal film layer.

On the other hand, the metal film layer preferentially dissolves and remains in the cleaning fluid as metal ions.

In general, when a local cell is formed between two different metals, one of these metals less noble than the other and having its larger natural electrode potential difference will more rapidly be dissolved.

Therefore, the materials for the aforementioned metal film layer may suitably be selected in consideration with the type of matrix metal material and the potential difference between the matrix metal material and the deposited film.

By forming a second metal film layer electrochemically more noble than the aforementioned matrix metal material on the surface of the aforementioned metal film layer through a thermal spraying, vapor depositing, sputtering, laminating or other process, a local cell is also formed between the second metal film layer and the lower metal film layer. Thus, the dissolution advances from both the interfaces between the lower metal film layer and the matrix metal material and between the lower metal film layer and the second metal film layer.

At this time, the potential difference between the second metal film layer and the lower metal film layer becomes larger than the potential difference between the matrix metal material and the lower metal film layer. Thus, the dissolution will more intensely advance in the vicinity of the interface between the second metal film layer and the lower metal film layer.

Now, if the potential in the deposited film is higher than that of the matrix metal material (for example, if the deposited film is made of molybdenum and the matrix metal material is aluminum or its alloy) and if the potential of the second metal film layer is higher than that of the matrix metal material, the matrix metal material becomes less noble than those of the deposited film and second metal film layer, resulting in the potential of the matrix metal material being lower than that of the deposited film or second metal film layer. This may cause the matrix metal material to be dissolved by the cleaning fluid.

In such a case, thus, the dissolution may be avoided by applying a positive electric field to the matrix metal material and immobilizing the matrix metal material so that it behaves as a metal more noble than the deposited film or second metal film layer.

BRIEF DESCRIPTION OF THE DRAWINGS

FIGS. 1(a), (b) and (c) are cross-sectional views, partially enlarged, of a component according to the present invention: FIG. 1(a) shows the component when it is dipped in a cleaning fluid after a metal film layer has been formed on the surface of a matrix metal material; FIG. 1(b) shows the component when it is dipped in the cleaning fluid after the second metal film layer has been formed on the surface of the metal film layer; and FIG. 1(c) shows a cleaning process for removing the deposited film by applying a positive electric field to the matrix metal material.

BEST MODE FOR CARRYING OUT THE INVENTION

FIG. 1(a) is an enlarged cross-sectional view of a component for a film forming equipment in which a metal film layer 2 is formed on the surface of a matrix metal material 1. The component comprising the matrix metal material 1 may include buffer plates such as substrate masks in the film forming equipment or wafer support frame. When a thin film is formed on a substrate from a film forming material in the film forming equipment, a deposited film d also deposits on the aforementioned component in addition to the substrate.

This deposited film thickly accumulates on the component as a number of substrates are successively processed to form films thereon in the film forming equipment. If the accumulated deposited film is broken at a certain time point, dust occurs. The dusts may fall on the substrate being processed to damage the intended properties of the formed film.

To remove this adhesion film d, the matrix metal material 1 may be dipped in a cleaning fluid S. However, the matrix metal material 1 must be dipped in the cleaning fluid S for a considerable time period (e.g., about two days) until the cleaning fluid S sufficiently penetrates into the deposited film d to separate it from the matrix metal material 1. This may also damage the matrix metal material.

Furthermore, the time period for which the matrix metal material 1 must be dipped in the cleaning fluid S may be shortened by forming a lower readily-soluble metal film layer on the surface of the matrix metal material 1 and further forming a porous metals film on the surface of this lower readily-soluble metal film layer. Even in such a case, time required to separate the deposited film from the matrix metal material 1 is in a range between 5 hours and 15 hours. This means that the component must be yet dipped in the cleaning fluid S for a long time, resulting in not a little damage to the matrix metal material 1.

A preferred material for forming the aforementioned lower readily-soluble metal film layer is a metal more readily soluble to the cleaning fluid S than the matrix metal material 1, for example, a copper alloy. If the matrix metal material 1 is or an aluminum alloy, the natural potential electrode measurement data show that copper alloy (JIS A5052 is $-1.02$ in one mol/l of sulfuric acid liquid) is more noble than or an alloy of aluminum (JIS A5052 is $-1.70$ in one mol/l of sulfuric acid liquid), as shown in Table 1. If the matrix metal material 1 of or an alloy of aluminum is dipped in the cleaning fluid for a long time, therefore, a local cell may be formed between or an alloy of aluminum and or an alloy of copper from the potential difference therebetween to promote the oxidization so that the matrix metal material 1 will more be dissolved.

It is intended herein that a more noble metal is one located above the reference metal in the table 1 while a less noble metal is one located below the reference metal in the table 1. Thus, whether a metal is more or less noble is determined relative to the reference metal.

The present invention can separate the deposited film d from the matrix metal material 1 along with the metal film layer 2 for a shortened time period (e.g., about 45 minutes) by forming a metal film layer 2 containing a metal less noble than the matrix metal material 1 on the surface of the matrix metal material 1 through thermal spraying, vapor depositing, sputtering, laminate or other process and by causing a local cell to be formed between the matrix metal material 1 and the metal film layer 2 to promote the dissolution of the metal film layer 2 when the matrix metal material 1 is dipped in the cleaning fluid S.

In other words, the local cell is formed between the matrix metal material 1 and metal film layer 2 by the potential difference therebetween, the local current then flowing from the matrix metal material 1 to the metal film layer 2.

On the other hand, the metal film layer preferentially dissolves and remains in the cleaning fluid as metal ions.

For example, if the metal film layer 2 is Al $-5\%$ In (its natural potential is $-1.17$ in one mol/l of sulfuric acid liquid) and the matrix metal material 1 is Al alloy (the natural electrode potential of JIS A5052 is $-0.70$ in one mol/l of sulfuric acid liquid) and when the deposited film d of 99.99% Al (4N—Al) (its natural potential is $-0.86$ in one mol/l of sulfuric acid liquid) deposits over the metal film layer 2, a local cell is formed between the matrix metal material 1 and the metal film layer 2 in the sulfuric acid liquid. The metal film layer 2 is ionized and dissolved into the sulfuric acid liquid.

The metal film layer 2 may suitably be selected from a group consisting of metals and alloys that can easily form the local cell between the metal film layer 2 and the matrix metal material 1, based on the natural potential E (Vvs.SCE) in the cleaning fluid S.

Referring now to FIG. 1(b), there is shown a second metal film layer 3 formed on the surface of the aforementioned metal film layer 2 through thermal spraying, vapor depositing, sputtering, laminating or other process, the second metal film layer 3 containing a metal more noble than the matrix metal material 1.

In this case, since, in the cleaning fluid S, a local cell is formed between the metal film layer 2 and the matrix metal material 1 and another local cell is also formed between the metal film layer 2 and the second metal film layer 3, the dissolution advances from both the interfaces between the metal film layer 2 and the matrix metal material 1 and between the metal film layer 2 and the second metal film layer 3, the deposited film d can be separated from the matrix metal material 1 more rapidly than the case of FIG. 1(a) that only the metal film layer 2 is formed.

For example, if the metal film layer 2 is Al-5% In; the second metal film layer 3 is Al alloy (the natural potential of JIS A2017 is −0.56 in one mol/l of sulfuric acid liquid); and the matrix metal material 1 is Al alloy (JIS A5052) and when 99.99% Al (4N—Al) film deposits on the second metal film layer 3, local cells are formed between the matrix metal material 1 and the metal film layer 2 and between the second metal film layer 3 and the metal film layer 2, respectively, in the sulfuric acid liquid. Thus, the metal film layer 2 is ionized and dissolved into the sulfuric acid liquid.

At this time, time required to dissolve the metal film layer 2 and separate the deposited film d from the matrix metal material 1 was about 15 minutes.

Referring now to FIG. 1(c), reference numeral 4 denotes a power source for applying a positive electric field to the matrix metal material 1 so that it will function as anode. The negative side of the power source 4 is connected to a cathode 5.

If the deposited film d has its potential higher than that of the matrix metal material 1 or if the second metal film layer 3 has its potential higher than that of the matrix metal material 1, the matrix metal material 1 may be less noble than the deposited film d or the second metal film layer 3. In this case, the matrix metal material 1 may dissolve into the cleaning fluid S.

However, this can be avoided by applying a positive electric field from the power source 4 to the matrix metal material 1 so that the matrix metal material 1 will be immobilized to behave as a metal more noble than the deposited film d or the second metal film layer 3.

As will be apparent from the above description, the present invention can separate the deposited film d from the matrix metal material 1 for an extremely shortened time period, without damaging the matrix metal material 1 itself from the cleaning fluid S by providing the aforementioned metal film layer 2 on the surface of the matrix metal material 1 of the component to form the local cell between the metal film layer 2 and the matrix metal material 1 or by providing the second metal film layer 3 on the surface of metal film layer 2 to form the local cell between the metal film layer 2 and the second metal film layer 3. Thus, it can be promoted to reuse the component while the life thereof can be extended.

Industrial Applicability

As described, the present invention provides the component for the film forming equipments and the method of cleaning the same are suitable for use in formation of the thin film on the substrate such as buffer plate (e.g., substrate mask) or wafer support plate from the film forming material through vapor depositing, sputtering, CVD or other process since the deposited film can be separated from the film forming equipment component for a shortened time period so that the matrix metal material can be less damaged by the cleaning fluid and since the components of the present invention and method thereof are led to extend the life of the components, reduce the running cost for the film forming equipment, and save the resource.

What is claimed is:

1. A component of a film forming equipment for forming a thin film on a substrate, the component having:
   a matrix material;
   a first means, on the matrix material, for forming a first local cell, when exposed to a cleaning liquid, with the matrix material, the first means being of such a character that a first local current flows from the matrix material to promote dissolution of the first means at an interface between the first means and the matrix material and to allow the removal of a film layer of the thin film from the matrix material; and
   a second means, on the first means, for forming a second local cell, when exposed to the cleaning liquid, the second means being of such a character that a second local current from the second means to promote dissolution of the first means at an interface between the first means and the second means and to allow the removal of the film layer of the thin film from the matrix material.

2. A component of a film forming equipment for forming a thin film on a substrate, the component having a surface onto which a deposited film of a film-forming material is formed during film formation, the component being configured to be removed from the film-forming equipment after film formation for cleaning in a cleaning fluid capable of removing the deposited film, the component comprising:
   a matrix material;
   a first metal film layer that is electrochemically less noble than the matrix metal material in the cleaning fluid and formed on the surface of the matrix metal material; and
   a second metal film layer that is electrochemically more noble than the matrix metal material in the cleaning fluid and formed on the surface of the first metal film layer; whereby
   when the component is dipped in the cleaning fluid, a first local cell is formed between the matrix metal material and a first metal film layer, and a second local cell is formed between the first metal film layer and the second metal film layer; and
   the deposited film is removed from the component in the cleaning fluid when the first metal film is dissolved as a result of the formation of the first and second local cells.

* * * * *